United States Patent
Liu et al.

(10) Patent No.: US 9,246,384 B2
(45) Date of Patent: Jan. 26, 2016

(54) CURRENT FEEDBACK METHOD, CURRENT FEEDBACK CIRCUIT, DRIVING CIRCUIT AND SWITCHING POWER SUPPLY THEREOF

(71) Applicant: Silergy Semiconductor Technology (Hangzhou) LTD, Hangzhou, ZheJiang Province (CN)

(72) Inventors: Guojia Liu, Hangzhou (CN); Wei Chen, Saratoga, CA (US)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 0 days.

(21) Appl. No.: 14/525,974

(22) Filed: Oct. 28, 2014

(65) Prior Publication Data
US 2015/0115922 A1 Apr. 30, 2015

(30) Foreign Application Priority Data
Oct. 31, 2013 (CN) .......................... 2013 1 0533046

(51) Int. Cl.
*H02M 3/156* (2006.01)
*H03K 7/08* (2006.01)
*H02M 1/00* (2007.01)

(52) U.S. Cl.
CPC ................. *H02M 3/156* (2013.01); *H03K 7/08* (2013.01); *H02M 2001/0009* (2013.01)

(58) Field of Classification Search
CPC ............................................. H02M 2001/0009
See application file for complete search history.

(56) References Cited

U.S. PATENT DOCUMENTS

| | | | | |
|---|---|---|---|---|
| 7,138,786 B2* | 11/2006 | Ishigaki | .............. | H02M 3/1588 323/224 |
| 7,432,694 B2 | 10/2008 | Brenden et al. | | |
| 7,859,326 B2* | 12/2010 | Nagasawa | ............. | G02M 3/156 327/548 |
| 8,749,222 B2* | 6/2014 | Williams | .......... | H01L 23/49575 324/76.11 |
| 8,779,744 B2* | 7/2014 | Kahn | .................... | H02M 3/156 323/271 |
| 8,810,230 B2* | 8/2014 | Ayukawa | ............ | H02M 1/4225 323/271 |
| 8,816,535 B2* | 8/2014 | Adest | ...................... | H02J 1/102 307/43 |
| 8,963,369 B2* | 2/2015 | Sella | ................. | H01L 31/02021 136/244 |
| 9,088,178 B2* | 7/2015 | Adest | ...................... | H02J 1/102 307/43 |
| 9,130,401 B2* | 9/2015 | Adest | ................ | H01L 31/02021 |

(Continued)

*Primary Examiner* — Timothy J Dole
*Assistant Examiner* — Yusef Ahmed
(74) *Attorney, Agent, or Firm* — Michael C. Stephens, Jr.

(57) ABSTRACT

In one embodiment, a current feedback circuit can include: (i) a first current mirror circuit having an input terminal coupled to a source of a main power transistor of a switching power supply, and a control terminal configured to receive a PWM control signal, the first current mirror circuit being configured to generate a first mirror current; (ii) the first current mirror circuit and the main power transistor being on such that an output sampling current flows through the first current mirror circuit and the main power transistor when the PWM control signal is active; and (iii) a second current mirror circuit configured to generate an output feedback current that is in a predetermined direct proportion with the output sampling current, and is generated in accordance with the first mirror current.

17 Claims, 6 Drawing Sheets

(56) References Cited

U.S. PATENT DOCUMENTS

| | | | |
|---|---|---|---|
| 2005/0242797 A1* | 11/2005 | Hesener | H02M 3/1584 323/282 |
| 2005/0285587 A1* | 12/2005 | Yang | H02M 3/33507 324/103 P |
| 2006/0066288 A1* | 3/2006 | Wheeler | H02M 3/1588 323/282 |
| 2007/0103005 A1* | 5/2007 | Nagasawa | H02M 3/156 307/125 |
| 2007/0159150 A1* | 7/2007 | Hosokawa | H02M 3/1588 323/285 |
| 2008/0007233 A1* | 1/2008 | Hane | H02M 3/156 323/282 |
| 2009/0141522 A1* | 6/2009 | Adest | H02J 1/102 363/55 |
| 2009/0206666 A1* | 8/2009 | Sella | H01L 31/02021 307/43 |
| 2010/0045895 A1* | 2/2010 | Komiya | G09G 3/3406 349/61 |
| 2010/0060250 A1* | 3/2010 | Noda | H02M 3/156 323/282 |
| 2010/0079127 A1* | 4/2010 | Grant | H02M 3/156 323/285 |
| 2011/0031934 A1* | 2/2011 | Pagano | H02M 3/156 320/145 |
| 2012/0081092 A1* | 4/2012 | Pavlin | G05F 1/46 323/282 |
| 2012/0256610 A1* | 10/2012 | D'Angelo | G05F 3/262 323/284 |
| 2013/0147374 A1* | 6/2013 | Kim | H05B 33/0824 315/186 |
| 2013/0313989 A1 | 11/2013 | Chen | |
| 2014/0097818 A1* | 4/2014 | Wiktor | H02M 3/156 323/283 |
| 2014/103895 A1 | 4/2014 | Xu et al. | |
| 2014/0117964 A1* | 5/2014 | Walters | H05B 33/0815 323/299 |
| 2014/0145679 A1 | 5/2014 | Chen | |
| 2014/0159998 A1 | 6/2014 | Huang | |
| 2014/0167724 A1 | 6/2014 | Deng et al. | |
| 2014/0210353 A1 | 7/2014 | Chen | |

* cited by examiner

CURRENT FEEDBACK METHOD, CURRENT FEEDBACK CIRCUIT, DRIVING CIRCUIT AND SWITCHING POWER SUPPLY THEREOF

RELATED APPLICATIONS

This application claims the benefit of Chinese Patent Application No. 201310533046.5, filed on Oct. 31, 2013, which is incorporated herein by reference in its entirety.

FIELD OF THE INVENTION

The present invention relates to electronics, and more particularly to switching power supplies, and associated current feedback and driving circuits and methods.

BACKGROUND

Switch mode power supplies can efficiently convert electrical power from a source to a load, or to several different loads, with each corresponding to a different output. The main transistor of a switching-mode supply can switch between on and off states at a given operating frequency, and voltage regulation can be achieved by varying the ratio of the on-to-off time of the main transistor. Switch mode power supplies may have relatively high power conversion efficiency, as compared to other types of power converters. Switch mode power supplies may also be substantially smaller and lighter than a linear supply due to the smaller transformer size and weight.

SUMMARY

In one embodiment, a current feedback circuit can include: (i) a first current mirror circuit having an input terminal coupled to a source of a main power transistor of a switching power supply, and a control terminal configured to receive a PWM control signal, the first current mirror circuit being configured to generate a first mirror current; (ii) the first current mirror circuit and the main power transistor being on such that an output sampling current flows through the first current mirror circuit and the main power transistor when the PWM control signal is active; and (iii) a second current mirror circuit configured to generate an output feedback current that is in a predetermined direct proportion with the output sampling current, and is generated in accordance with the first mirror current.

In one embodiment, a current feedback method can include: (i) receiving, by a first current mirror circuit, a PWM control signal; (ii) turning on the first current mirror circuit and a main power transistor of a switching power supply such than an output sampling current flows through the first current mirror circuit and a source of the main power transistor when the PWM control signal is active; (iii) generating, by a second current mirror circuit, an output feedback current in a predetermined direct proportion to the output sampling current; and (iv) providing the output feedback current to a current detection pin.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Source driving circuits are widely used in switching power supplies due to their relatively low power losses and high conversion efficiency. In source driving circuits, a gate voltage of a main power switch (e.g., a transistor) may be fixed as a constant value, and the on/off status of the main power transistor can be controlled by varying a source voltage.

Figure 1:
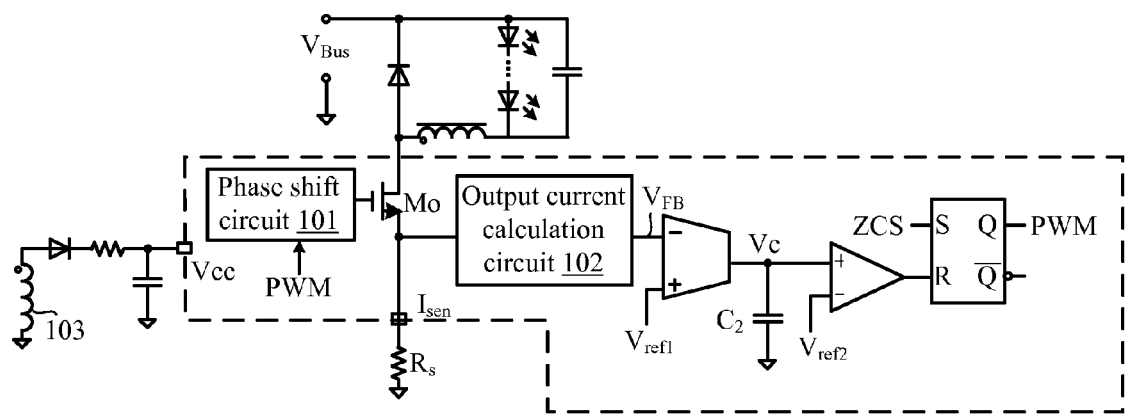
FIG. 1 is a schematic block diagram of an example source driving switching power supply with an output current feedback circuit.

Referring now to FIG. 1, shown is a schematic block diagram of an example source driving switching power supply with an output current feedback circuit. In this example, the drain of main power transistor Mo can connect to an output terminal of the switching power supply. Also, the source of main power transistor Mo can connect to a current detection pin (Isen) of the current feedback circuit. The gate of main power transistor Mo can receive a pulse-width modulation (PWM) control signal via phase shift circuit 101. Therefore, the on/off state of main power transistor Mo can be controlled by the PWM control signal.

When the PWM control signal is active (e.g., high), main power transistor Mo can be turned on, and a current flowing through the source to current detection pin $I_{sen}$ can be sampled as a sampling current. In one example, sampling resistor $R_s$ can be coupled to current detection pin $I_{sen}$ in order to generate an output feedback voltage signal that represents the output current of the switching power supply. This output feedback voltage signal can be provided to output current calculation circuit 102. Thus, the PWM control signal may be generated in accordance with the output feedback voltage signal to provide feedback control for the output current.

In some cases, a parasitic capacitor between the source and drain of main power transistor Mo can be relatively large, and a charging/discharging current of the parasitic capacitor may flow through current detection pin $I_{sen}$. In this case, the sampling current at current detection pin $I_{sen}$ may be interfered with by the charging/discharging current. In addition, power losses generated by sampling resistor $R_s$ may be relatively large in this approach. Power loss $P_{RS}$ of sampling resistor $R_s$ can be represented as below in formula (1).

$$P_{RS} = I_{pk}^2 \times R_S \times \frac{D}{3} \tag{1}$$

For example Ipk may represent a peak value of sampling current Io' flowing through main power transistor Mo, Io may represent an average value of sampling current Io', and D can represent a duty cycle of the PWM control signal. Peak value $I_{pk}$ of sampling current Io' can be represented as below in formula (2).

$$I_{pk} = 2 \times I_o = \frac{V_{ref1}}{R_S} \tag{2}$$

In accordance with formulas (1) and (2), formula (3) below can be derived.

$$P_{RS} = \frac{D \times V_{ref1}^2}{3 \times R_S} \tag{3}$$

For example, $V_{ref1}$ can be a reference voltage that represents an expected output feedback value. Furthermore, external auxiliary winding 103 can be utilized to obtain supply voltage Vcc to supply power for current feedback circuit 101, which can be an integrated circuit (IC) or chip.

In one embodiment, a current feedback method can include: (i) receiving, by a first current mirror circuit, a PWM control signal; (ii) turning on the first current mirror circuit and a main power transistor of a switching power supply such than an output sampling current flows through the first current mirror circuit and a source of the main power transistor when the PWM control signal is active; (iii) generating, by a second current mirror circuit, an output feedback current in a predetermined direct proportion to the output sampling current; and (iv) providing the output feedback current to a current detection pin.

Figure 2:
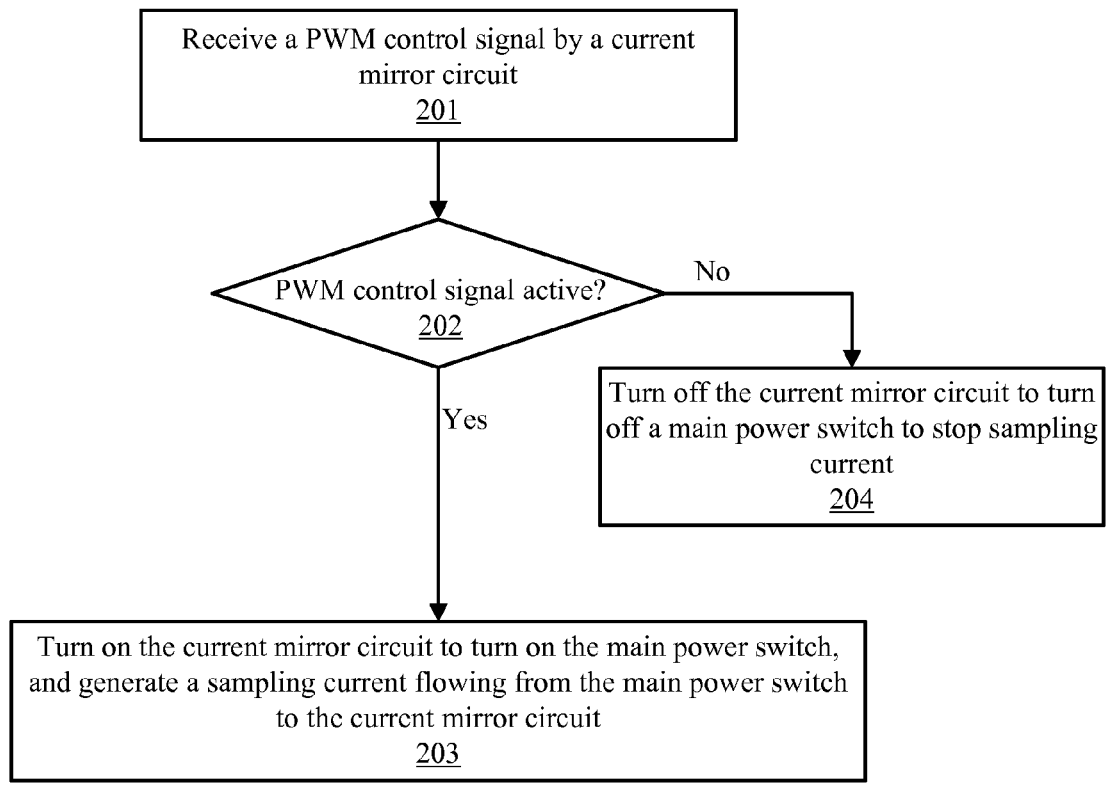
FIG. 2 is a flow diagram of a first example current feedback method, in accordance with embodiments of the present invention.

Referring now to FIG. 2, shown is a flow diagram of a first example current feedback method, in accordance with embodiments of the present invention. At 201, a PWM control signal can be received by a current mirror circuit. In accordance with PWM control principles, a duty cycle of the PWM control signal can be regulated by a feedback control mode, in order to maintain the output electrical signal as substantially constant. For example, the current mirror circuit can be configured as a cascode current mirror, and may receive the PWM control signal at its control terminal.

At 202, a determination can be made as to whether the PWM control signal is active. In some cases, the PWM control signal may be active high; however, particular embodiments also support cases where the PWM control signal is active low. When the PWM control signal is active, at 203, the current mirror circuit may be turned on such that the main power switch conducts. Also, a sampling current can be generated that flows from the main power transistor to the current mirror circuit. Further, an output feedback current in a predetermined direct proportion with the sampling current can be generated at the current detection pin by the current mirror.

An input terminal of the current mirror circuit can connect to the source of the main power switch or transistor, and an output terminal of the current mirror circuit can connect to the current detection pin. In some cases, the output terminal can be directly connected to the current detection pin, while in other cases the output terminal of the current mirror circuit can be indirectly connected to the current detection pin. When the PWM control signal is active, the current mirror circuit can be turned on, and the voltage at the source of the main power transistor can be adjusted such that the main power transistor conducts. The sampling current can flow from the source of the main power transistor to an input terminal of a mirror circuit. The current mirror circuit can generate the output feedback current in a predetermined proportion to the sampling current, which can be provided to the current detection pin directly, or indirectly via other circuitry.

At 204, the current mirror circuit can be turned off in order to turn off the main power transistor, which may then stop sampling of the current. When the PWM control signal is inactive, the current mirror circuit can be turned off. Thus, the voltage at the source of the main power transistor can be adjusted to turn off the main power switch. Because no current is sampled in this case, there may be no output feedback current at the current detection pin.

In this way, the on and off states of the main power transistor can be controlled by changing the voltage at the source, which can be controlled in accordance with the on/off state of the current mirror circuit. For example, when the PWM control signal is active, the current mirror circuit and the main power transistor are turned on in sequence. The sampling current then flows from the source of the main power transistor to the input terminal of the mirror circuit. A current in a predetermined proportion with the sampling current at the current detection pin flowing from the output terminal of the current mirror circuit can be configured as the output feedback current that represents the output current of the switching power supply.

In this particular example, the current detection pin and the main power transistor can be indirectly coupled by the current mirror circuit, in order to avoid possible interference from the charging and discharging current of a parasitic capacitor of the main power transistor to the current detection pin. This can improve the accuracy of the output feedback current. Also, proportionality coefficient $K_o$ of the output feedback current and the sampling current can be less than 1, and power losses generated by sampling resistor $R_s$ at current detection pin $I_{sen}$ can be decreased. Power loss $P_{RS}'$ of sampling resistor $R_s$ can be indicated as below in formula (4).

$$P'_{RS} = I_{fbpk}^2 \times R_S \times \frac{D}{3} = (K_o \times I_{pk})^2 \times R_S \times \frac{D}{3} \tag{4}$$

For example, $I_{pk}$ can represent a peak value of the sampling current flowing from the source of main power transistor Mo, Rs can represent a resistance of sampling resistor $R_s$, and $I_{fpk}$ can represent a peak value of output feedback current $I_{fb}$. From formulas (3) and (4), the ratio between power loss $P_{RS}'$ and power loss $P_{RS}$ can be represented as below per formula (5).

$$\frac{(2)}{(1)} = \frac{P'_{RS}}{P_{RS}} = K_o^2 \quad (5)$$

Because proportionality coefficient $K_o$ is less than 1, the power loss of sampling resistor $R_s$ can be significantly decreased. In addition, a second current mirror circuit can be coupled between an output terminal of the first current mirror circuit, and the current detection pin in this example can mirror a first mirror current at the output terminal of the first current mirror circuit, in order to generate a second mirror current as the output feedback current at the current detection pin. For example, the proportionality coefficient between the first mirror current and the sampling current may be represented as k1, the proportionality coefficient between the second mirror current and the first mirror current may be represented as k2, and thus proportionality coefficient $K_o$ can be the product of k1 and k2.

$$ko = k1 \times k2 \quad (6)$$

The power loss of sampling resistor $R_s$ can be further decreased by regulating the values of k1 and k2. In this case, when the PWM control signal is active, the voltages at the input and output terminals of the first current mirror circuit can be clamped to a same value to guarantee an accurate proportionality relationship between the first mirror current and the sampling current. Therefore, the sampling current can be sampled accurately by a first mirror current to guarantee the accuracy of the output feedback current at the current detection pin. A current follower coupled between the output terminal of the first current mirror circuit and the input terminal of the second current mirror circuit can be also included, and may be configured to transfer the first mirror current to the second current mirror circuit.

In one example (see, e.g., FIGS. 4 and 5), the current follower can include operational amplifier A1 and transistor $M_3$. For example, the non-inverting input terminal of operational amplifier A1 can connect to an input terminal of mirror circuit 401, the inverting input terminal of operational amplifier A1 can connect to the output terminal of mirror circuit 401, and the output terminal can connect to the gate of transistor $M_3$. The source of transistor $M_3$ can connect to the inverting input terminal of operational amplifier A1, and the drain can be coupled to the current detection pin (e.g., via current mirror circuit 402). Mirror current $I_1$ can be provided to the source of transistor $M_3$. Also, voltages at the input and output terminals of the current mirror circuit 401 can be clamped to be a same value in that these terminals can be connected to the input terminals of operational amplifier A1.

Figure 3:
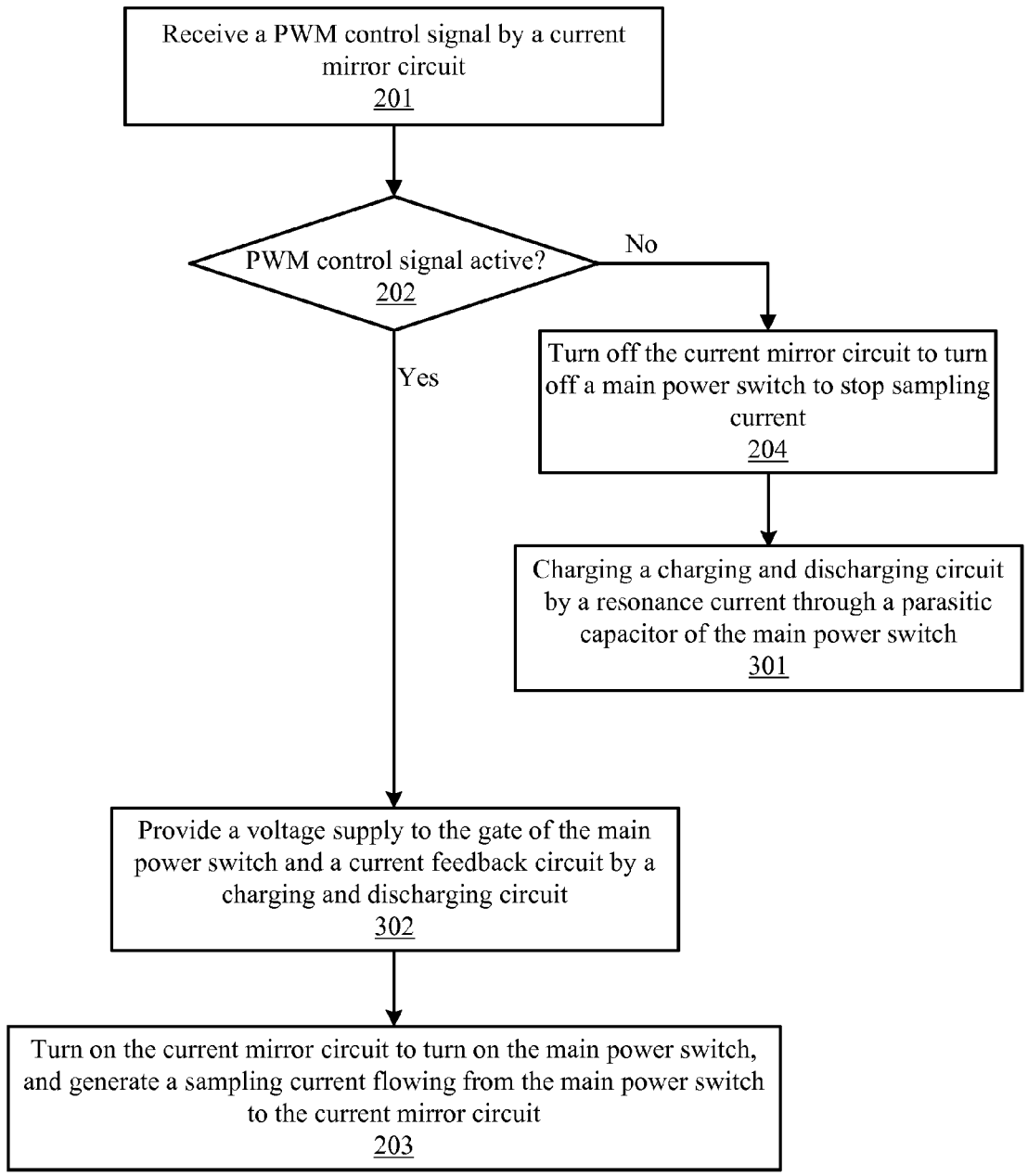
FIG. 3 is a flow diagram of a second example current feedback method, in accordance with embodiments of the present invention.

Referring now to FIG. 3, shown is a flow diagram of a second example current feedback method, in accordance with embodiments of the present invention. When the PWM control signal is inactive, after 204, 301 can occur, and when the PWM control signal is active, before 203, 302 can occur. At 301, a resonance of an inductor of the switching power supply and the parasitic capacitor of the main power transistor can occur, and a charging and discharging circuit may be charged by a resonance current through the parasitic capacitor of the main power switch.

When the PWM control signal is inactive, current mirror circuit 401 can be turned off, and the voltage at the source of the main power transistor can be adjusted to turn off the main power switch. At this time, resonance of the inductor of the switching power supply and the parasitic capacitor (e.g., between the drain and source) of the main power transistor can occur. The charging and discharging circuit can be charged by the resonance current through the parasitic capacitor until the resonance current decreases to zero.

At 302, a voltage of the charging and discharging circuit can be utilized as the voltage at the gate of the main power switch, and also as a supply for the current feedback circuit (e.g., an integrated circuit [IC]). When the PWM control signal is active, 203 and 302 can occur, and the charging and discharging circuit may discharge to supply voltage to the gate of the main power transistor and the current feedback circuit, in order to achieve a self-powered IC. In this way, a self-powered current feedback circuit can be provided to save energy, and the size and cost of the circuit may be decreased without the use of an auxiliary winding.

In one embodiment, a current feedback circuit can include: (i) a first current mirror circuit having an input terminal coupled to a source of a main power transistor of a switching power supply, and a control terminal configured to receive a PWM control signal, the first current mirror circuit being configured to generate a first mirror current; (ii) the first current mirror circuit and the main power transistor being on such that an output sampling current flows through the first current mirror circuit and the main power transistor when the PWM control signal is active; and (iii) a second current mirror circuit configured to generate an output feedback current that is in a predetermined direct proportion with the output sampling current, and is generated in accordance with the first mirror current.

Figure 4:
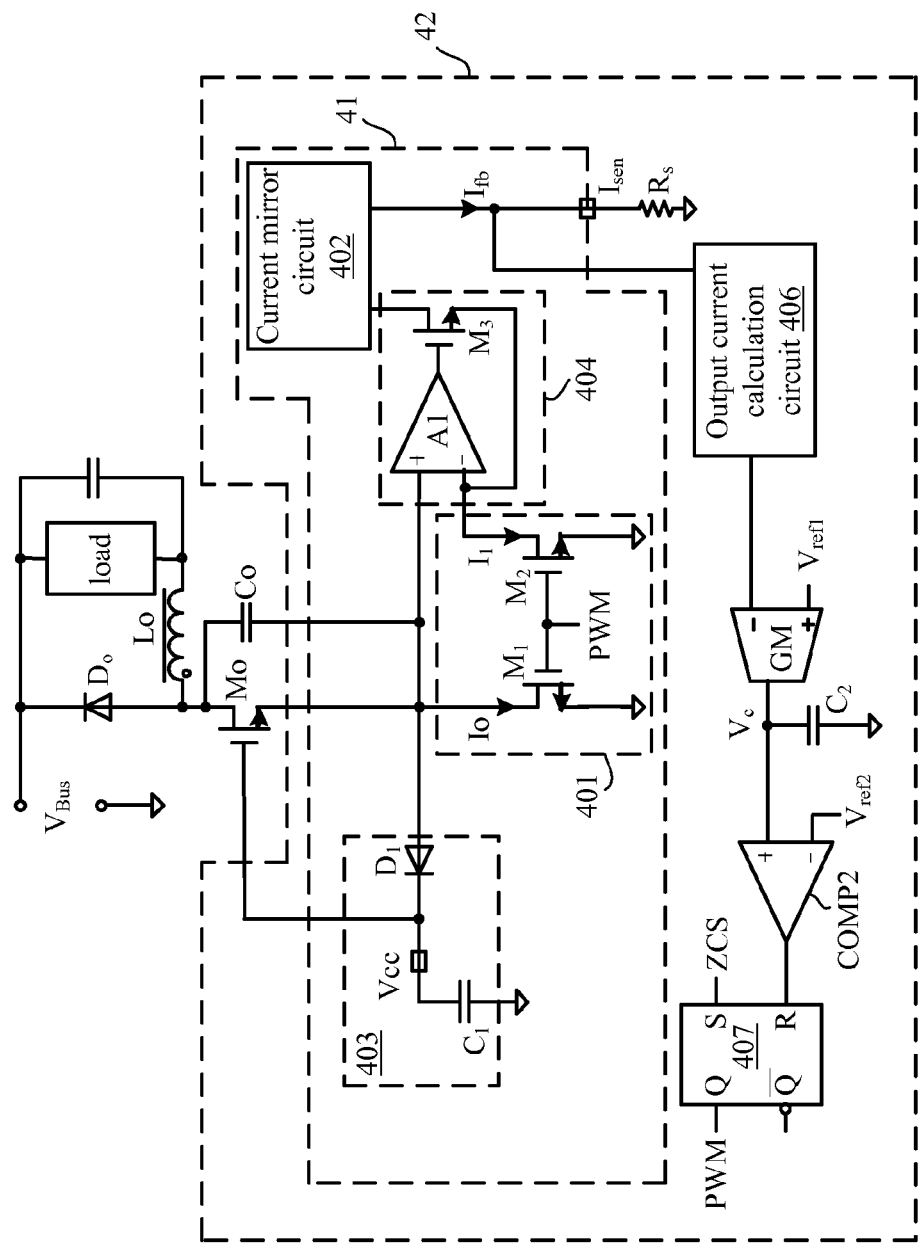
FIG. 4 is a schematic block diagram of an example switching power supply with a current feedback driving circuit, in accordance with embodiments of the present invention.
Figure 5:
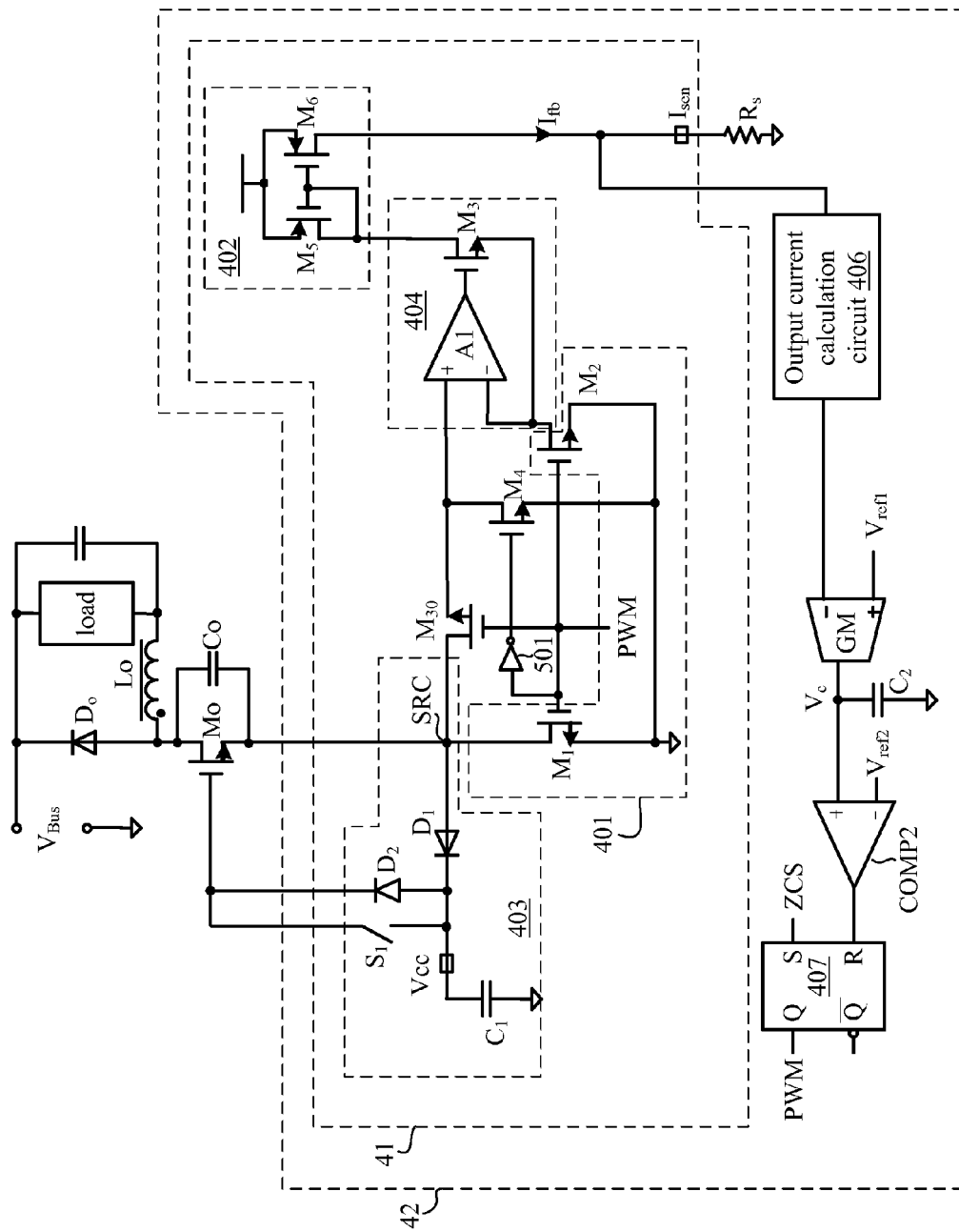
FIG. 5 is a schematic block diagram of another example switching power supply with a current feedback driving circuit, in accordance with embodiments of the present invention.

Referring now to FIGS. 4 and 5, shown are schematic block diagrams of example switching power supplies with current feedback driving circuits, in accordance with embodiments of the present invention. For example, current feedback circuit 41 can include current mirror circuit 401 with an input terminal that can connect to the source of main power transistor Mo, an output terminal that can be coupled to current detection pin $I_{sen}$, and a control terminal that can receive the PWM control signal.

When the PWM control signal is active, current mirror circuit 401 can be turned on to change the voltage at the source of main power transistor Mo, such that main power transistor Mo turns on to conduct. Sampling current Io can then flow from the source of main power transistor Mo to current mirror circuit 401. Mirror current $I_1$ can be generated at the output terminal of current mirror circuit 401. Output feedback current $I_{fb}$, in direct proportion (e.g., proportionality coefficient $K_o$) with sampling current at current detection pin $I_{sen}$, can be provided from current mirror circuit 401.

In this particular example, the voltage at the source of main power transistor Mo can be changed in accordance with the on and off states of current mirror circuit 401 to control the on/off state of main power transistor Mo. When the PWM control signal is active, main power transistor Mo can be turned on, and output sampling current Io may flow from the source of main power transistor Mo to the input terminal of current mirror circuit 401. Output feedback current $I_{fb}$, in predetermined direct proportion with output sampling current Io and representing the present output current, can be at current detection pin $I_{sen}$ in accordance with the current at the output terminal of current mirror circuit 401.

Current detection pin $I_{sen}$ may not be directly connected to main power transistor Mo. Rather current detection pin $I_{sen}$ may be indirectly connected (e.g., via other circuitry) to main power switch Mo. Therefore, charging and discharging current of parasitic capacitor Co of main power transistor Mo may not flow into current detection pin $I_{sen}$. This arrangement can substantially avoid interference to the current detection pin, and may also increase the accuracy of output feedback current $I_{fb}$ at current detection pin $I_{sen}$.

Current mirror circuit 401 can include transistors $M_1$ and $M_2$. For example, the gates of transistors $M_1$ and $M_2$ can connect to the PWM control signal, and the sources of transistors $M_1$ and $M_2$ can connect to ground. The drain of transistor $M_1$ can be configured as the input terminal of mirror 401 and can connect to the source of main power transistor Mo. The drain of transistor $M_2$ can be configured as the output terminal of mirror circuit 401, and may be coupled to current detection pin $I_{sen}$. When the PWM control signal is active, transistor $M_1$ can be turned on to pull down the voltage of the source of the main power transistor to turn on main power transistor Mo. Output sampling current Io can then flow from the source of main power transistor Mo to the drain of transistor $M_1$.

Correspondingly, mirror current $I_1$ can be generated at the drain of transistor $M_2$ which may be in a predetermined direct proportion with output sampling current Io. Transistor $M_2$ can be directly or indirectly connected to current detection pin $I_{sen}$, such as through circuitry between transistor $M_2$ and current detection pin $I_{sen}$. Output feedback current $I_{fb}$, which can be mirror current $I_1$ or a current in direct proportion with mirror current $I_1$, can be generated at current detection pin $I_{sen}$. In one example, if the ratio between the area of transistor $M_2$ and that of transistor $M_1$ is k1 (e.g., a positive number), mirror current $I_1$ can be represented as below per formula (7).

$$I1 = Io \times k1 \quad (7)$$

Because output sampling current Io can represent the output current of the switching power supply, mirror current $I_1$ can also represent the output current. Whether output feedback current $I_{fb}$ represents the output current is determined by whether it is consistent with (e.g., the same value as) mirror current $I_1$, or is in a predetermined direct proportion with mirror current $I_1$.

Current feedback circuit 41 can also include current mirror circuit 402 coupled between the output terminal of current mirror circuit 401 and current detection pin $I_{sen}$, such as between the drain of transistor $M_2$ and current detection pin $I_{sen}$. Current mirror circuit 402 can mirror current $I_1$ and may generate output feedback current $I_{fb}$ in a predetermined direct proportion with mirror current $I_1$. The coefficient of proportionality can be a constant value, and output feedback current $I_{fb}$ may be provided to current detection pin $I_{sen}$. In this arrangement, main power transistor Mo and current detection pin $I_{sen}$ can be further isolated to further decrease possible interference to current detection pin $I_{sen}$ from the charging/discharging current of parasitic capacitor Co of main power transistor Mo. This can also improve the accuracy of output feedback current $I_{fb}$ at current detection pin $I_{sen}$.

Assuming that the proportionality coefficient between mirror current $I_1$ and output sampling current Io is k1, and the proportionality coefficient between mirror current $I_2$ and mirror current $I_1$ is k2, the proportionality coefficient ko between output feedback current $I_1$, and output sampling current Io can be represented as below in formula (8).

$$k0 = k1 \times k2 \quad (8)$$

The values of k1 and k2 can be modulated to further decrease power losses of sampling resistor $R_s$. In addition, sampling resistor $R_s$ can be configured as a smaller package resistor. Current feedback circuit 41 can also include charging and discharging circuit 403 coupled to the source of main power transistor Mo. When the PWM control signal is inactive, main power transistor Mo can be turned off, and inductor Lo of the switching power supply and parasitic capacitor Co can form a resonant circuit. Charging and discharging circuit 403 can be charged by a resonant current through parasitic capacitor Co. When the PWM control signal is active, main power transistor Mo can be turned on, and charging and discharging circuit 403 may be configured to provide voltage supply Vcc to current feedback circuit 41 to achieve a self-powered current feedback circuit 41.

Charging and discharging circuit 403 can include capacitor $C_1$ and diode $D_1$. The anode of diode $D_1$ can connect to the source of main power transistor Mo, and the cathode of diode $D_1$ can connect to the gate of main power transistor Mo, and to one terminal of capacitor $C_1$. The other terminal of capacitor $C_1$ can connect to ground. When main power transistor Mo is turned off, capacitor $C_1$ may be charged by the resonant current through parasitic capacitor Co and diode $D_1$. When main power transistor Mo is turned on, capacitor $C_1$ can supply voltage supply Vcc to current feedback circuit 41.

Current feedback circuit 41 can also include current follower 404 with operational amplifier A1 and transistor $M_3$. The input terminals of operational amplifier A1 can connect to the input and output terminals of current mirror circuit 401, and the output terminal of operational amplifier A1 may be coupled to current detection pin $I_{sen}$ through transistor $M_3$. For example, the output terminal of operational amplifier A1 can connect to the gate of transistor $M_3$, the inverting input terminal can connect to the source of transistor $M_3$, and the drain of transistor $M_3$ can be configured as the output terminal of current follower 404, and may be coupled to current detection pin $I_{sen}$. Mirror current $I_1$ can be provided to current mirror circuit 402 through current follower 404. In this example arrangement, main power transistor Mo and current detection pin $I_{sen}$ can be further isolated to decrease possible interference to current detection pin $I_{sen}$ by the resonant current. In addition, accuracy of output feedback current $I_{fb}$ at current detection pin $I_{sen}$ can be improved due to this isolation.

Current feedback circuit 41 can also include a switching circuit coupled between charging and discharging circuit 403 and the non-inverting input terminal of operational amplifier A1. The control terminal of the switching circuit (e.g., including transistor $M_{30}$) can receive the PWM control signal. When the PWM control signal is inactive, transistor $M_{30}$ can be turned off to isolate charging and discharging circuit 403 from the non-inverting input terminal of operational amplifier A1. Therefore, voltage supply Vcc to operational amplifier A1 may be cut off to protect operational amplifier A1 from a possible high voltage surge.

In the example of FIG. 5, current feedback circuit 41 may also include a switching circuit (e.g., including inverter 501 and transistor $M_4$) coupled between the non-inverting input terminal of operational amplifier A1 and ground. When the PWM control signal is inactive, transistor $M_4$ can be turned on to pull down the voltage at the non-inverting input terminal of operational amplifier A1 to zero, in order to protect operational amplifier A1. The PWM control signal can connect to the gate of transistor $M_4$ through inverter 501, the drain of transistor $M_4$ can connect to the non-inverting input terminal of operational amplifier A1, and the source of transistor $M_4$ can connect to ground.

Output feedback current $I_{fb}$ can be generated at current detection pin $I_{sen}$ by current feedback circuit 41. In some cases, sampling resistor $R_s$ can connect to current detection pin $I_{sen}$ in order to generate an output feedback voltage signal. Output current calculation circuit 406 may calculate a voltage signal that represents the present output current in accordance with the output feedback voltage signal and a duty cycle of main power transistor Mo.

Error amplifier GM can generate an error amplifying signal that represents an error between the present output current and an expected output current, based on the voltage signal and reference voltage $V_{ref1}$, which can represent the expected output current. The error amplifying signal can be compensated by capacitor $C_2$ to generate loop control signal Vc that may represent the error between the present output current and the expected output current. Comparator COMP2 may compare loop control signal Vc against reference voltage $V_{ref2}$ to generate a comparison signal. This compensation signal can be provided to RS flip-flop 407 to control the on time (Ton) of the PWM control signal, in order to maintain the output current as substantially constant.

Figure 6:
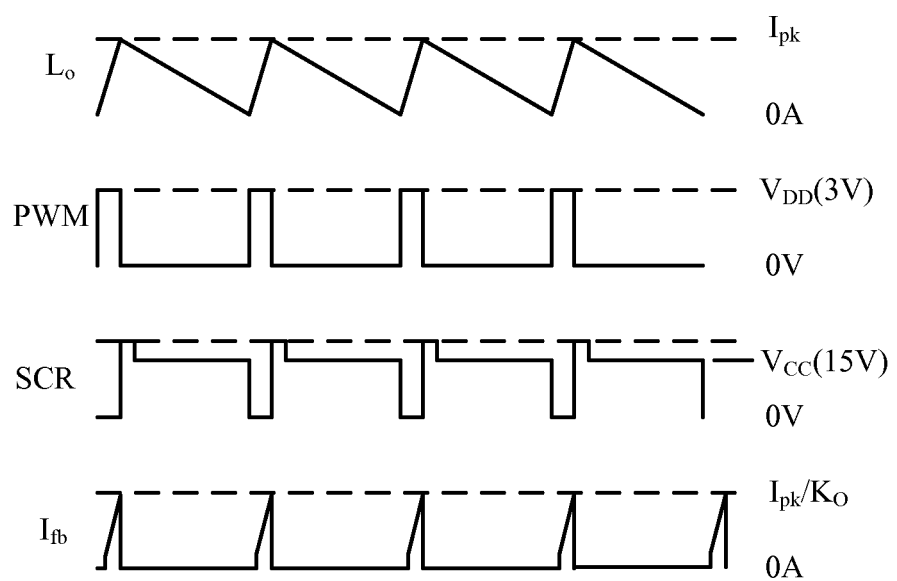
FIG. 6 is a waveform diagram of example operation of the switching power supply with a current feedback driving circuit, in accordance with embodiments of the present invention.

Referring now to FIG. 6, shown is a waveform diagram of example operation of the switching power supply with a current feedback driving circuit, in accordance with embodiments of the present invention. When the PWM control signal is high, inductor Lo may be excited such that a current flowing through inductor Lo continuously increases. At this time, transistors $M_1$, $M_2$, and $M_{30}$ may all be turned on. Output sampling current Io flowing through main power transistor Mo can be sampled by transistors $M_1$ and $M_2$, and provided to current mirror circuit 402 (e.g., including transistors $M_5$ and $M_6$ coupled in cascode mode) through current follower 404. Output feedback current $I_{fb}$ can thus flow from transistor $M_6$ to current detection pin $I_{sen}$.

When the PWM control signal is inactive, main power transistor Mo, and transistors $M_1$, $M_2$, and $M_{30}$ may all be turned off. Transistor $M_4$ can be turned on to make the voltage at the non-inverting input terminal of operational amplifier A1 be zero to avoid possible damage to operational amplifier A1 due to a floating voltage. At this time, there may be no current at current detection pin $I_{sen}$. A resonant current generated by the resonance between inductor Lo and parasitic capacitor Co of main power transistor Mo can be used to charge capacitor $C_1$ through parasitic capacitor Co. Thus, with charge accumulation of capacitor $C_1$, the voltage at the source of main power transistor Mo can continuously increase, and voltage Vcc across capacitor $C_1$ can be configured to provide voltage supply to current feedback circuit 41, for a self-powered system.

In this fashion, accurate output feedback current $I_{fb}$ can be obtained, and based on this output feedback current, the output current of the switching power supply can be controlled to be substantially constant. Further, a substantially self-powered system can be accommodated, power losses can be decreased, and stability and security can be improved, relative to other approaches.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A current feedback circuit, comprising:
   a) a first current mirror circuit having an input terminal coupled to a source of a main power transistor of a switching power supply, and a control terminal configured to receive a pulse-width modulation (PWM) control signal, said first current mirror circuit being configured to generate a first mirror current;
   b) said first current mirror circuit and said main power transistor being on such that an output sampling current flows through said first current mirror circuit and said main power transistor when said PWM control signal is active;
   c) a second current mirror circuit configured to generate an output feedback current that is in a predetermined direct proportion with said output sampling current, and is generated in accordance with said first mirror current;
   d) a current follower with input terminals coupled to a charging and discharging circuit and said first current mirror circuit, and an output terminal coupled to a current detection pin, wherein said current follower comprises an operational amplifier having input terminals coupled to input and output terminals of said first current mirror circuit, and a first transistor having a gate coupled to an output terminal of said operation amplifier, a source coupled to an inverting input terminal of said operational amplifier, and a drain coupled to said current detection pin; and
   e) a first switch circuit coupled between said charging and discharging circuit and an input terminal of said operational amplifier, wherein said first switch circuit is off when said PWM control signal is inactive.

2. The current feedback circuit of claim 1, wherein said current feedback circuit is integrated into a chip comprising said current detection pin coupled to an output terminal of said first current mirror circuit.

3. The current feedback circuit of claim 2, wherein said first current mirror circuit is configured as a cascode current mirror with an input terminal coupled to said main power switch, and being configured to generate said first mirror current at said output terminal.

4. The current feedback circuit of claim 3, wherein said first current mirror circuit comprises:
   a) second and third transistors having gates coupled to said PWM control signal, sources coupled to ground, wherein a drain of said second transistor is coupled to a source of said main power transistor, and a drain of said third transistor is coupled to said current detection pin; and
   b) said second and third transistors and said main power transistor being on when said PWM control signal is active, wherein said output sampling current flows through said main power transistor and said second transistor, and said output feedback current flows through said third transistor and said current detection pin.

5. The current feedback circuit of claim 3, wherein said second current mirror is circuit coupled between said output terminal of said first current mirror circuit and said current detection pin, said second current mirror being configured to mirror said first mirror current to generate said output feedback current.

6. The current feedback circuit of claim 3, wherein:
   a) said charging and discharging circuit is coupled to said gate and said source of said main power transistor;
   b) said charging and discharging circuit is charged by a resonant current generated by an inductor of said switching power supply through a parasitic capacitor of said main power transistor when said main power transistor is turned off; and
   c) said charging and discharging circuit is configured to provide a voltage supply to said current detection circuit when said main power transistor is on.

7. The current feedback circuit of claim 6, wherein said charging and discharging circuit comprises:
   a) a diode having an anode coupled to said source of said main power transistor, and a cathode coupled to said gate of said main power transistor; and
   b) a capacitor coupled to said gate of said main power transistor, and to ground.

8. The current feedback circuit of claim 7, wherein said current feedback circuit comprises a supply pin coupled between said capacitor and said diode.

9. The current feedback circuit of claim 1, further comprising a second switch circuit coupled between an input terminal of said operational amplifier and ground, wherein said second switch circuit is on when said PWM control signal is inactive.

10. The current feedback circuit of claim 9, wherein second switch circuit comprises:
   a) an inverter is coupled between said PWM control signal and a gate of a fourth transistor; and
   b) said fourth transistor having a drain coupled to a non-inverting input terminal of said operational amplifier, and a source coupled to ground.

11. The current feedback circuit of claim 1, further comprising a sampling resistor coupled to said current detection pin.

12. A driving circuit for a switching power supply, the driving circuit comprising:
   a) the current feedback circuit of claim 1; and
   b) a PWM control signal generation circuit configured to generate said PWM control in accordance with said output feedback current.

13. A switching power supply, comprising:
   a) the driving circuit of claim 12; and
   b) a power stage having said main power transistor, wherein said driving circuit is configured to drive said main power transistor in accordance with said PWM control signal to maintain said output current of said switching power supply as substantially constant.

14. A method of controlling a current feedback circuit, the method comprising:
   a) receiving, by a first current mirror circuit, a pulse-width modulation (PWM) control signal;
   b) turning on said first current mirror circuit and a main power transistor of a switching power supply such than an output sampling current flows through said first current mirror circuit and a source of said main power transistor when said PWM control signal is active;
   c) generating, by a second current mirror circuit, an output feedback current in a predetermined direct proportion to said output sampling current; and
   d) providing said output feedback current to a current detection pin;
   e) wherein said current feedback circuit comprises a current follower with input terminals coupled to a charging and discharging circuit and said first current mirror circuit, and an output terminal coupled to a current detection pin, wherein said current follower comprises an operational amplifier having input terminals coupled to input and output terminals of said first current mirror circuit, and a first transistor having a gate coupled to an output terminal of said operation amplifier, a source coupled to an inverting input terminal of said operational amplifier, and a drain coupled to said current detection pin; and
   f) wherein said current feedback circuit comprises a first switch circuit coupled between said charging and discharging circuit and an input terminal of said operational amplifier, wherein said first switch circuit is off when said PWM control signal is inactive.

15. The method of claim 14, wherein:
   a) said first current mirror circuit and said main power transistor are off when said PWM control signal is inactive;
   b) said charging and discharging circuit is charged by a resonant current from resonance between an inductor of said switching power supply and a parasitic capacitor of said main power transistor; and
   c) said charging and discharging circuit is configured to provide a voltage supply to a gate of said main power transistor and a current detection circuit chip comprising said first current mirror circuit when said PWM control signal is active.

16. The method of claim 14, further comprising:
   a) generating a first mirror current at an output terminal of said first mirror circuit; and
   b) mirroring said first mirror current to generate said output feedback current.

17. The method of claim 14, further comprising:
   a) following said first mirror current by said current follower; and
   b) providing an output current of said current follower to said second current mirror circuit.

* * * * *